United States Patent
Rigo et al.

(10) Patent No.: US 11,075,647 B2
(45) Date of Patent: Jul. 27, 2021

(54) METHODS AND APPARATUS TO COMPRESS DATA

(71) Applicant: Movidius LTD, Schiphol-Rijk (NL)

(72) Inventors: Valentina Rigo, Dublin (IE); David Bernard, Kilcullen (IE); Peter McGlynn, Dublin (IE)

(73) Assignee: Movidius Limited, Schiphol-Rijk (NL)

( * ) Notice: Subject to any disclaimer, the term of this patent is extended or adjusted under 35 U.S.C. 154(b) by 157 days.

(21) Appl. No.: 16/288,026

(22) Filed: Feb. 27, 2019

(65) Prior Publication Data

US 2020/0274552 A1 Aug. 27, 2020

(51) Int. Cl.
*H03M 7/30* (2006.01)
*H03M 7/46* (2006.01)
*H03M 7/40* (2006.01)

(52) U.S. Cl.
CPC .......... *H03M 7/6023* (2013.01); *H03M 7/40* (2013.01); *H03M 7/46* (2013.01); *H03M 7/6088* (2013.01)

(58) Field of Classification Search
CPC ........ H03M 7/40; H03M 7/46; H03M 7/6023; H03M 7/6064; H03M 7/6088
USPC ................................................. 382/232, 234
See application file for complete search history.

(56) References Cited

U.S. PATENT DOCUMENTS

| | | | |
|---|---|---|---|
| 8,194,736 B2 * | 6/2012 | Youn | H04N 19/85 375/240.12 |
| 10,164,654 B2 * | 12/2018 | Inoue | H03M 7/48 |
| 2011/0078222 A1 * | 3/2011 | Wegener | H03M 7/3059 708/203 |

* cited by examiner

*Primary Examiner* — Daniel G Mariam
(74) *Attorney, Agent, or Firm* — Hanley, Flight & Zimmerman, LLC

(57) ABSTRACT

Methods, apparatus, systems and articles of manufacture to compress data are disclosed. An example apparatus includes an off-chip memory to store data; a data slicer to split a dataset into a plurality of blocks of data; a data processor to select a first compression technique for a first block of the plurality of blocks of data based on first characteristics of the first block; and select a second compression technique for a second block of the plurality of blocks of data based on second characteristics of the second block; a first compressor to compress the first block using the first compression technique to generate a first compressed block of data; a second compressor to compress the second block using the second compression technique to generate a second compressed block of data; a header generator to generate a first header identifying the first compression technique and a second header identifying the second compression technique; and an interface to transmit the first compressed block of data with the first header and the second compressed block of data with the second header to be stored in the off chip memory.

25 Claims, 8 Drawing Sheets

METHODS AND APPARATUS TO COMPRESS DATA

FIELD OF THE DISCLOSURE

This disclosure relates generally to processors, and, more particularly, to methods and apparatus to compress data.

BACKGROUND

In recent years, hardware based neural networks being implemented on a processor chip (e.g., on-chip) have increased in popularity in a variety of data processing systems. Neural networks provide a framework for machine learning algorithms to work together and process large and/or complex data. In some examples, neural networks are connected to off-chip memory (e.g., memory located off the processor chip) to provide increase available capacity of the on-chip neural network.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
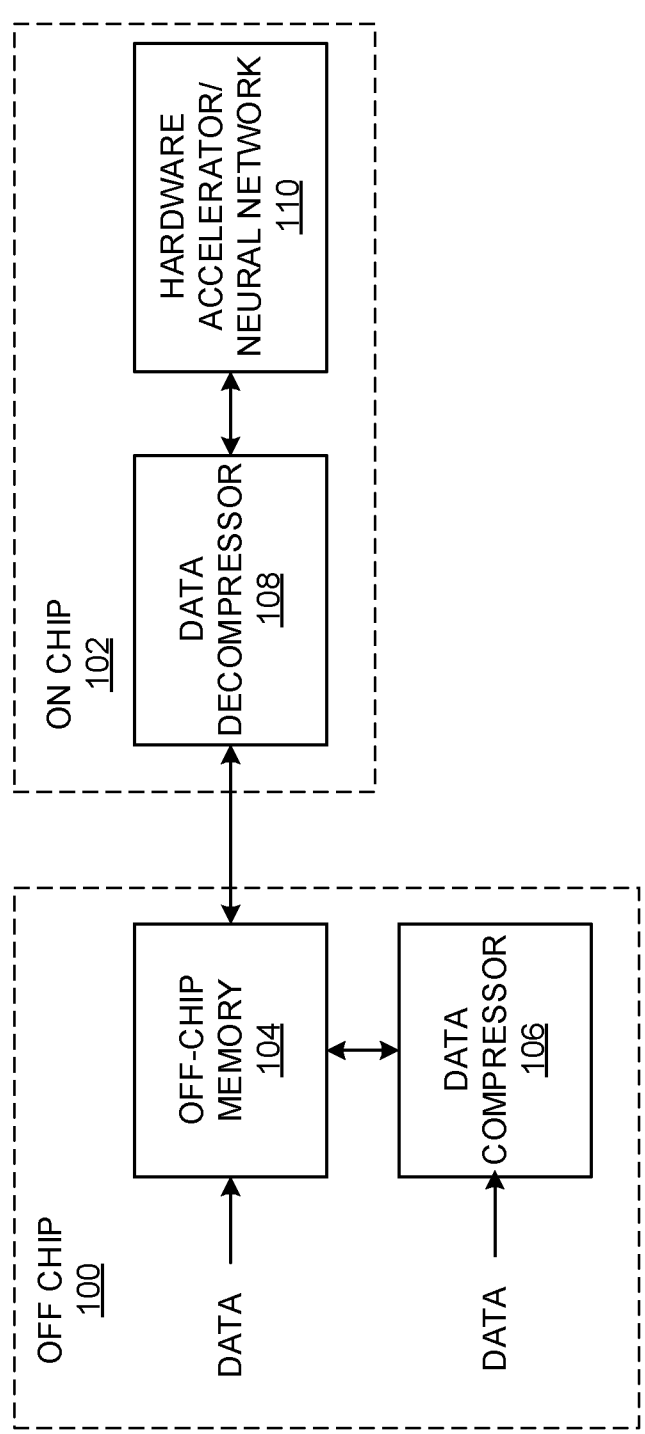
FIG. 1 is a block implementation of a diagram including an example data compressor and a data decompressor.

Typical computing systems, including personal computers and/or mobile devices, employ advanced image processing or computer vision algorithms to automate tasks that human vison can perform. Computer vision tasks include acquiring, processing, analyzing, and/or understanding digital images. Such tasks facilitate, in part, extraction of dimensional data from the digital images to produce numerical and/or symbolic information. Computer vision algorithms can use the numerical and/or symbolic information to make decisions and/or otherwise perform operations associated with three-dimensional (3-D) pose estimation, event detection, object recognition, video tracking, etc., among others. To support augmented reality (AR), virtual reality (VR), robotics and/or other applications, it is then accordingly important to perform such tasks quickly (e.g., in real time or near real time) and efficiently.

Advanced image processing or computer vision algorithms sometimes employ a hardware accelerator and/or a convolutional neural network (CNN, or ConvNet). A hardware accelerator is a hardware component that perform functions (e.g., classify images, cluster images, perform object recognition, etc.) more efficiently than software implemented by a general-purpose central processing unit (CPU). A CNN is a deep, artificial neural network that can be used to classify images, cluster the images by similarity (e.g., a photo search), and/or perform object recognition within the images using convolution. As used herein, convolution is defined to be a function derived from two given functions by integration that expresses how a shape of one of the functions is modified by a shape of the other function. Thus, a CNN can be used to identify faces, individuals, street signs, animals, etc., included in an input image by passing an output of one or more filters corresponding to an image feature (e.g., a horizontal line, a two-dimensional (2-D) shape, etc.) over the input image to identify matches of the image feature within the input image.

Some hardware accelerators and/or CNNs have limited memory capacity. Accordingly, such hardware accelerators and/or CNNs located on a processor chip may be connected to memory (e.g., off-chip memory such as dynamic random-access memory (DRAM)) to increase the capacity to support increased data processing power of the hardware accelerators and/or CNNs. However, transferring data from off-chip memory to an on-chip hardware accelerator and/or CNN creates a bottleneck effect corresponding to a limited bandwidth, limiting the processing power of the hardware accelerator and/or CNN. Some techniques reduce bandwidth requirements of an off-chip memory interface using a lossless compression technique (e.g., Huffman compression) to reduce the amount of data that needs to be moved to the on-chip hardware accelerator and/or CNN. However, such techniques are not compatible with the frequencies at which some hardware accelerators and/or CNNs run and/or the frequencies at which a decoder needs to be run.

Examples disclosed herein include an off-chip data compression technique for optimizing bandwidth improvement offered by lossless encoding techniques while enabling hardware decompression implementation compatible with the frequencies of hardware accelerators and/or CNNs. Examples disclosed herein include splitting (e.g., grouping) data to be stored an off-chip memory into a number of blocks of data and applying a compression technique (e.g., run-length encoding (RLE), partial Huffman encoding, no encoding, and/or any other lossless compression technique) in a per-block basis based on the characteristics of the data of each block.

For example, if all the data in a block corresponds to the same character (e.g., all '0's, all '1', all 'a's), examples disclosed herein compress the block using the RLE encoding. RLE encoding is a lossless data compression that compresses all the block data into a single value representative of all values of the block including information of the number of characters in the original block. For example, if the block is a 16 character block of data, where each character corresponds to a '0,' the RLE encoding would compress the subblock into a single character '0' representative of the 16 '0' characters including a character (e.g., 16) indicating the original size of the block of data.

If the data in the block does not all correspond to a same character, examples disclosed herein may perform Huffman technique (e.g., a full Huffman technique or partial Huffman technique). A Huffman technique is a lossless data compression/encoding algorithm to assign variable length codes to input characters, wherein the lengths of the codes are based on the frequency of the corresponding input characters. Accordingly, the Huffman technique results in non-uniform length codes. For example, a more frequent character of a block is assigned to a smaller length code than a less frequent character of the block. Accordingly, a Huffman technique reduces the size of a block of data with repeated characters. To apply Huffman encoding, a Huffman tree is generated based on the frequency of appearance of each character in a set of data. Each character of data of the block is assigned to a code based on the Huffman tree. In most cases, encoding data using a Huffman encoding technique results in a lossless data compression.

A partial Huffman encoding technique includes only applying the Huffman encoding techniques to a preset number of characters and leaving the rest of the characters unencoded. Each character is then marked or tagged as encoded or not encoded. In this manner, the decoding time is decreased and the size of the Huffman table needed to decode the Huffman encoded data is decreased. Decreasing the size of the Huffman table decreases the amount of data that needs to be transmitted to the decoder along with the encoded data. Additionally, decreasing the Huffman table facilitates hardware solutions that increase the decoding speed. Examples disclosed herein generally correspond to a partial Huffman technique. However, a full Huffman technique can alternatively be used.

Additionally, examples disclosed herein split the Huffman encoded block of data into encoded data sub-blocks. Such encoded data sub-blocks can be padded by adding a preset code at the end of each sub-block so an on-chip decoder can separate the sub-blocks for parallel decoding, thereby increasing computational bandwidth. In some examples, such as when there are few or no repeat characters in a block, a partial Huffman technique may not reduce the size of the block of data due to the amount of overhead corresponding to an included header. Accordingly, examples disclosed herein do not perform any compression/encoding technique for blocks where the partial Huffman technique does not reduce the size of the block of data.

Using examples disclosed herein, a user can tailor a compression scheme to a specific application data profile to achieve a higher compression ratio. Additionally, examples disclosed herein reduce a Huffman encoding lookup table requirements to be compatible with hardware memory limitation and speed requirement. Additionally, examples disclosed herein enable decoding and/or encoding parallelization, thereby corresponding to higher decoding bandwidth.

FIG. 1 is a block diagram of example off-chip components 100 and example on-chip components 102. The example off-chip components 100 include example off-chip memory 104 to store data/data sets and an example data compressor 106 to compress data sets stored in the example off-chip memory 104 prior to transmitting to the example on-chip components 102 for hardware based processing. The example on-chip components 102 include an example data decompressor 108 to decompress compressed data sets and an example hardware accelerator/neural network engine 110 to process the data set. Although the example block diagram of FIG. 1 includes the off-chip components 100, the example off-chip memory 104 and/or the example data compressor 106 may be located on the same chip as the example on-chip components 102 (e.g., all the components of FIG. 1 may be located on the same chip).

The example off-chip components 100 of FIG. 1 includes the off-chip memory 104 (e.g., DRAM) to store data to be processed by the hardware accelerator/neural network 110.

The example off-chip memory 104 increases the memory capacity of the example hardware accelerator/neural network 110 by providing additional memory to store additional data that may be processed by the hardware accelerator/neural network 110. As described above, transferring uncompressed data from the off-chip memory 104 to the hardware accelerator/neural network 110 creates a bottle neck due to the bandwidth limitations of the off chip memory 104 (e.g., DRAM). Accordingly, the example data compressor 106 compresses the data to be stored into and/or already stored in the off-chip memory 104 prior to transmitting to the on-chip components 102 to reduce the size of the data to reduce and/or eliminate the bottle neck issues. The example data compressor 106 compresses the data by breaking the stored data into blocks of data and using three compression/encoding techniques based on the characteristics of the data of the blocks. Additionally, the example data compressor 106 generates a header the blocks (e.g., a first header for a first block, a second header for a second block, etc.) that identify the compression/encoding technique used and provides information (e.g., block size, encoding tables, sub-block sizes, etc.) that the example data decompressor 108 can use to decompress the blocks. In this manner, the example data decompressor 108 can properly decompress the compressed data. Once compressed, the example data compressor 106 stores the compressed data in the example off-chip memory 104. In this manner, the off chip memory 104 can transmit the compressed data to be processed by the example hardware accelerator/neural network 110. In some examples, the data compressor 106 includes multiple processors to compress multiple blocks of the data in parallel, thereby increasing the computational bandwidth. The example data compressor 106 is further described below in conjunction with FIG. 2.

The example on-chip components 102 of FIG. 1 include the data decompressor 108 to interface with the off-chip components 100 to receive the compressed data from the off-chip memory 104 and decompresses the compressed data prior to being transmitted to the hardware accelerator/neural network 110. In some examples, the data decompressor 108 is a hardware accelerator. The example data decompressor 108 receives the compressed data and identifies the headers of the blocks of the compressed data to determine the compression technique the compressed blocks. In this manner, the data decompressor 108 decompresses the compressed blocks based on the compression technique identified in the header of each block. Once decompressed, the example data decompressor 108 transmits the decompressed data to the example hardware accelerator/neural network 110. The example hardware accelerator/neural network 110 processes the decompressed data based on the configuration of the hardware accelerator/neural network 110. The example data decompressor 108 is further described below in conjunction with FIG. 2.

Figure 2:
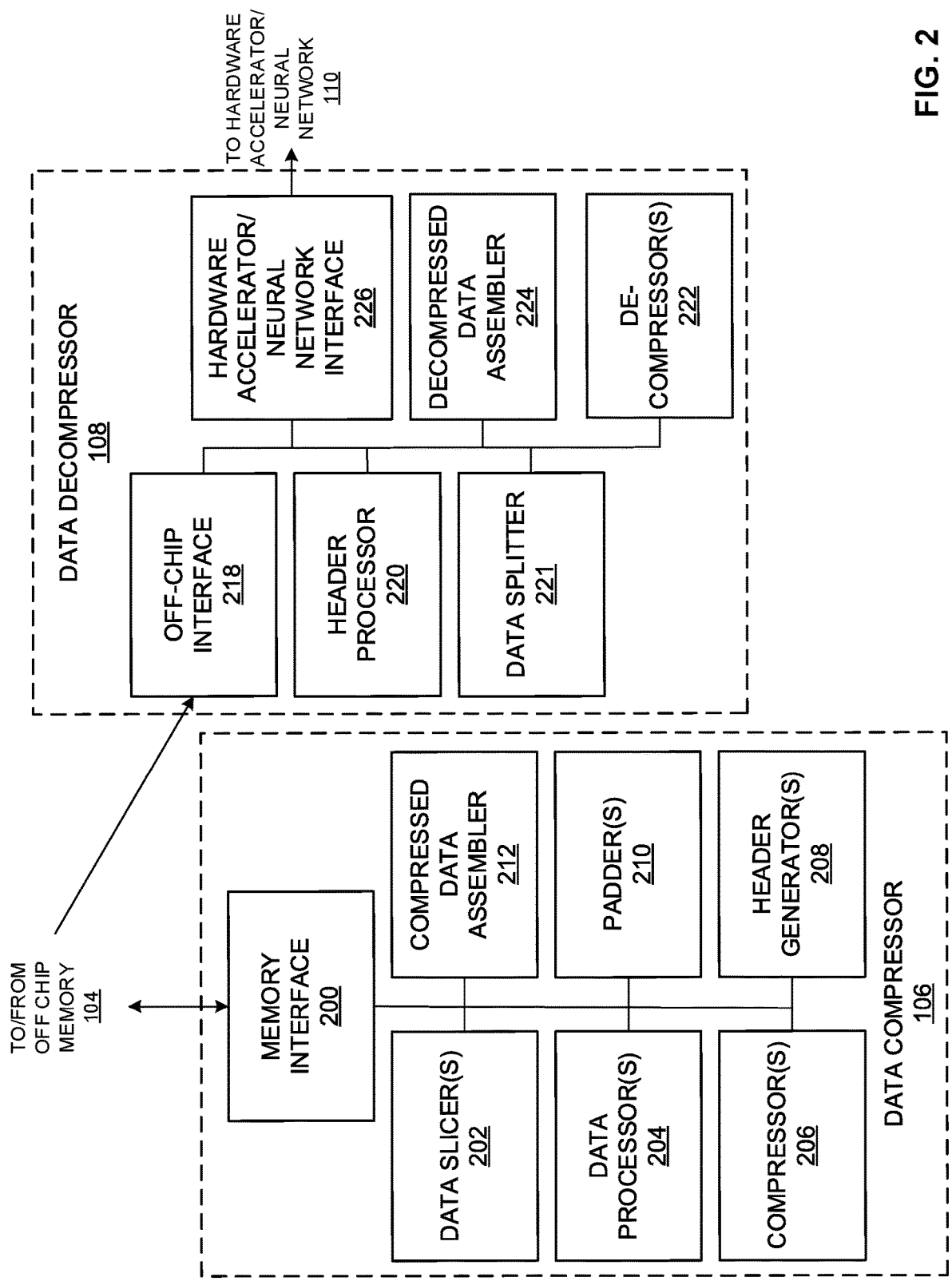
FIG. 2 is a block diagram of an example implementation of the data compressor and the data decompressor of FIG. 1.

FIG. 2 is a block diagram of an example implementation of the example data compressor 106 and a block diagram of an example implementation of the example data decompressor 108 of FIG. 1. The example data compressor 106 includes example memory interface 200, the example data slicer(s) 202, the example data processor(s) 204, an example compressor(s) 206, an example header generator(s) 208, an example padder(s) 210, and an example compressed data assembler 212. The example data decompressor 108 includes an example off-chip interface 218, an example header processor 220, an example data splitter 221, an example decompressor(s) 222, an example decompressed data assembler 224, and the example hardware accelerator/ neural network interface 226.

The example memory interface 200 of FIG. 2 receives data from the example off-chip memory 104 of FIG. 1 to be compressed and transmitted to the example on-chip data decompressor 108. Once the data compressor 106 compresses the data, the example memory interface 200 of FIG. 2 transmits the compressed data to the example off-chip memory 104 so that the compressed data can be retrieved by the on-chip components 102 of FIG. 1.

Once the memory interface 200 obtains data from the example off-chip memory 104, the example data slicer 202 separates (e.g., slices) the data into blocks of data. In some examples, the data slicer(s) 202 separates the data into a uniform fixed size block. Additionally, the data slicer(s) 202 may slice encoded data (e.g., a block that has been encoded using partial Huffman compression) into an encoded data sub-block to enable parallel decompression processing of the example data decompressor 108, as further described below. In some examples, the data slicer(s) 202 includes two data slicers. For example, there may be a first data slicer to separate the original data into data blocks and a second data slicer to separate Huffman encoded data into encoded data sub-blocks.

The example data processer(s) 204 of FIG. 2 are one or more data processors to determine (e.g., select) a compression technique to use for the data blocks (e.g., RLE encoding, Huffman encoding, no encoding, and/or any other lossless compression technique), based on the characteristics of the data of the blocks. For example, when the data processor(s) 204 obtains a block, the data processor(s) 204 determines if all the data of the block correspond to the same value and/or character (e.g., all '0's, all '1's, all 'a's, etc.). If the data processor(s) 204 determines that the data of the block corresponds to the same value/character, the data processor(s) 204 determines that an RLE encoding technique may be applied to the block to compress the block without loss of information. If the data processor(s) 204 determines that the data of the block corresponds to different values/characters, the data processor(s) 204 may determine that Huffman encoding (e.g., partial or full) or no encoding should be applied to the block. As described above, applying a Huffman encoding technique to some blocks may result in a larger amount of data (e.g., when the block has little or no repeated values/characters). Accordingly, in some examples, the example data processor(s) 204 may process the blocks of data to determine if a partial Huffman encoding technique of the block of data will result in a smaller or larger amount of data. In such examples, if the example data processor(s) 204 determines that the partial Huffman encoding of the block of data results in more data than no encoding (e.g., using probabilistic modeling), the data processor(s) 204 determines that no encoding will be applied to the block of data. In other examples, the compressor(s) 206 applies partial Huffman encoding to the data and the data processor(s) 204 determines if the result is larger or smaller than not applying a compression technique (e.g., no encoding). If the data processor(s) 204 determines that the result is larger than not applying the compression technique, the data processor(s) 204 discards the Huffman encoding data, thereby leaving the block of data to remain unencoded (e.g., uncompressed). The data processor(s) 204 may be a single data processor or multiple data processors. For example, multiple data processors 204 may be utilized for processing blocks of data in parallel.

The example compressor(s) 206 of FIG. 2 performs a compression technique (e.g., RLE encoding, Huffman encoding, and/or any other lossless compression technique) to a block of data based on the technique selected by the data processor(s) 204. As described above, the data processor(s) 204 selects RLE encoding when all the data of the block corresponds to the same value and/or character (e.g., all '0's, all '1's, all 'a's, etc.). When the data processor(s) 204 selects RLE for a block of data, the data processor(s) 204 instructs the header generator(s) 208 to generate a header or data packet identifying the repeated value of the block and/or the number of repetitions of the value. For example, if the block is an 8 character block where each bit correspond to '1,' the data processor(s) 204 instructs the header generator(s) 208 to generate a header identifying that each of the 8 characters corresponds to a value of '1' and an indication that '1' is repeated 8 times.

When the data processor(s) 204 of FIG. 2 selects a Huffman encoding or partial Huffman encoding, the example compressor(s) 206 applies Huffman encoding or partial Huffman encoding to the block of data. As described above, to apply Huffman encoding, a Huffman tree is generated based on the frequency of appearance of each character in a set of data. Each character of data of the block is assigned to a code based on the Huffman tree. In most cases, encoding data using a Huffman encoding technique results in a lossless data compression. A partial Huffman encoding technique includes only applying the Huffman encoding techniques to a preset number of characters and leaving the rest of the characters unencoded, thereby decreasing decoding time and decreasing the size of the Huffman table needed to decode the Huffman encoded data. The characters in the encoded data are pre-appended a marker that identifies whether the character is encoded or not. In some examples, the data processor(s) 204 determine which and/or how many preset characters to include in the Huffman encoding technique a trade-off between header overhead and data compression. For example, the data processor(s) 204 may determine that a partial Huffman technique may be applied to only 8 characters of 236 possible characters. Accordingly, the data processor(s) 204 will determine the 8 characters of the data that are repeated most often and the compressor(s) 206 will apply symbols for the 8 determined characters to apply partial Huffman encoding using the 8 determined characters. Applying a partial Huffman encoding technique allows for faster compression and allows the memory 104 to transmit a smaller Huffman table used to decompress (e.g., decode) blocks that have been compressed using the Huffman encoding technique. The compressor(s) 206 may be a single compressor or multiple compressors. For example, multiple compressors 206 may be utilized for encode (e.g., compress) blocks of data in parallel.

The example header generator(s) 208 of FIG. 2 generates a header and/or data packet identifying the encoding and/or compression type (e.g., RLE encoding, Huffman encoding, no encoding, and/or any other lossless compression technique) used to encode and/or compress the block of data. For example, if the compression type of the block is an RLE compression, the header generator(s) 208 generates a header and/or data packet that identifies RLE compression as well as the repeated character corresponding to the RLE compression and the number of times the character is repeated. If the compression type of the block is a Huffman compression or a partial Huffman compression, the header generator 208 generates a header and/or data packet corresponding to the Huffman and/or partial Huffman compression technique. For example, the header generator 208 may generate a header to include an indication that the block is Huffman encoded, the table(s) to decode the data, the size of the encoded data, the size of the sub-blocks, and/or a character marker indicating whether the sub-block is encoded. If the compression type of the block is not encoded and/or compressed, the example header generator 208 generates a header and/or data packet corresponding to no compression and/or encoding and the size of the unencoded data. The example header generator(s) 208 adds the header and/or data packet to the encoded or unencoded block. In this manner, the example data decompressor 108 can identify which compression technique was used for each block and decompress the compressed block based on the compression technique. The header generator(s) 208 may be a single header generator or multiple header generators. For example, the header generators 208 may be utilized generate headers for blocks of data in parallel.

When a Huffman encoding or a partial Huffman encoding is applied to a block of data to generate Huffman encoded data, the example slicer(s) 202 of FIG. 2 slices (e.g., groups) the Huffman encoded data into a preset number of encoded sub-blocks corresponding to N number of encoded sub-blocks. For example, if the encoded data includes 27 Huffman codes, and the preset number of encoded sub-blocks is 9, then the slicer(s) 202 groups 3 Huffman codes for each sub-block. The preset number of encoded sub-blocks may be based on the number of parallel processors of the data decompressor 108. In this manner, each parallel processor can process each encoded sub-block or N number of sub-blocks in parallel. Once sliced into the encoded sub-blocks, the example padder(s) 210 pad the individual sub-blocks with a predefined code pattern representative of the end of the sub-block. As described above, the Huffman codes are variable (e.g., non-uniform) in length. For example, a first Huffman code of a first 16-bit sub-block may be 8-bits in length while a second Huffman code of a second 16-bit sub-block may be 10-bits in length. Accordingly, grouping one or more Huffman codes will correspond to variable (e.g., non-uniform) length encoded sub-block. Thus, the padder(s) 210 adds the predefined code to the end of the sub-block and the header generator 208 includes the size of the padded sub-block in the header so that the example data decompressor 108 can separate the individual encoded sub-blocks based on the size identified in the header to facilitate parallel decoding. The padder(s) 210 may be a single padder or multiple padders. For example, the padders 210 may be utilized pad encoded sub-blocks in parallel.

The example compressed data assembler 212 of FIG. 2 assembles the padded encoded sub-blocks in order with the generated header to complete the Huffman encoding of a block of data. Additionally, the example compressed data assembler 212 assembles the encoded (e.g., compressed) or unencoded (e.g., uncompressed) data blocks to generate the entire compressed data to be transmitted to the example data decompressor 108. In some examples, the data blocks may be processed in parallel. Accordingly, the compressed data assembler 212 monitors the blocks to be able to assemble the encoded blocks in the same order that the blocks of data were ordered prior to encoding.

The example off-chip interface 218 of FIG. 2 obtains compressed data from the example off-chip memory 104. Once the compressed data is obtained, the example header processor 220 processes the compressed data to identify the headers of the blocks of the compressed data. As described above, the headers include information identifying the encoding technique used to compress each block of the compressed data. Accordingly, the header processor 220 can separate the compressed blocks by identifying the headers for decompression of the blocks of data (e.g., one-by-one or in parallel).

The example decompressor(s) 222 of FIG. 2 decompresses the blocks of data based on the corresponding compression information identified in the head of each corresponding block. For example, if a first header of a first block of encoded data corresponds to an RLE compression, the decompressor 222 processes the first header to identify which character is repeated and how many times the character is repeated and passes the determined number of repeated characters to the decompressed data assembler 224. The number of times may be preset or may be identified in the header. If a second header of a second block of encoded data corresponds to no encoding, the decompressor(s) 222 removes the header and passes the unencoded data to the decompression data assembler without decompressing (e.g., decoding) that data. If a third header of a third block of encoded data corresponds to Huffman encoding (e.g., partial or full), the decompressor(s) 222 decompresses the third block of encoded data using a Huffman table from the header of the block corresponding to the Huffman codes. In some examples, the data splitter 221 break the block of compressed data into sub-blocks based on the sub-block sizes identified within the header. In this matter, each of the sub-groups can be parallel processed by the multiple decompressors 222. Once decompressed, the decompressors 222 pass the decompressed sub-blocks to the example decompressed data assembler 224.

The example decompressed data assembler 224 of FIG. 2 assembles the decoded sub-blocks in order to complete the Huffman decoding of a block of data. For example, if there are multiple decompressors 222 to decode Huffman encoded sub-blocks in parallel, the decompressed data assembler 224 monitors the parallel processors to be able to order the decompressed sub-blocks to generate a decompressed block of data. Additionally, the example decompressed data assembler 224 assembles the decoded (e.g., decompressed) data blocks to generate the entire decompressed data to be transmitted to the example hardware accelerator/neural network 110. In some examples, the data blocks are processed (e.g., decompressed and/or decoded) in parallel. Accordingly, the decompressed data assembler 224 monitors the blocks to be able to assemble the decoded blocks in the same order that the blocks of data were received. The example hardware accelerator/neural network interface 226 of FIG. 2 transmits the full set of decompressed data to the example hardware accelerator/neural network 110 of the on-chip components 102 of FIG. 1.

While an example manner of implementing the example data compressor 106 and the example data decompressor 108 of FIG. 1 is illustrated in FIG. 2, one or more of the elements, processes and/or devices illustrated in FIG. 2 may be combined, divided, re-arranged, omitted, eliminated and/or implemented in any other way. Further the example memory interface 200, the example data slicer(s) 202, the example data processor(s) 204, the example compressor(s) 206, the example header generator(s) 208, the example padder(s) 210, the example compressed data assembler 212, the example off-chip interface 218, the example header processor 220, the example data splitter 221, the example decompressor(s) 222, the example decompressed data assembler 224, the example hardware accelerator/neural network interface 226, and/or, more generally, the example data compressor 106 and/or the example data decompressor 108 of FIG. 2 may be implemented by hardware, software, firmware and/or any combination of hardware, software and/or firmware. Thus, for example, any of the example memory interface 200, the example data slicer(s) 202, the example data processor(s) 204, the example compressor(s) 206, the example header generator(s) 208, the example padder(s) 210, the example compressed data assembler 212, the example off-chip interface 218, the example header processor 220, the example data splitter 221, the example decompressor(s) 222, the example decompressed data assembler 224, the example hardware accelerator/neural network interface 226, and/or, more generally, the example data compressor 106 and/or the example data decompressor 108 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example memory interface 200, the example data slicer(s) 202, the example data processor(s) 204, the example compressor(s) 206, the example header generator(s) 208, the example padder(s) 210, the example compressed data assembler 212, the example off-chip interface 218, the example header processor 220, the example data splitter 221, the example decompressor(s) 222, the example decompressed data assembler 224, the example hardware accelerator/neural network interface 226, and/or, more generally, the example data compressor 106 and/or the example data decompressor 108 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example data compressor 106 and/or the data decompressor 108 of FIG. 2 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
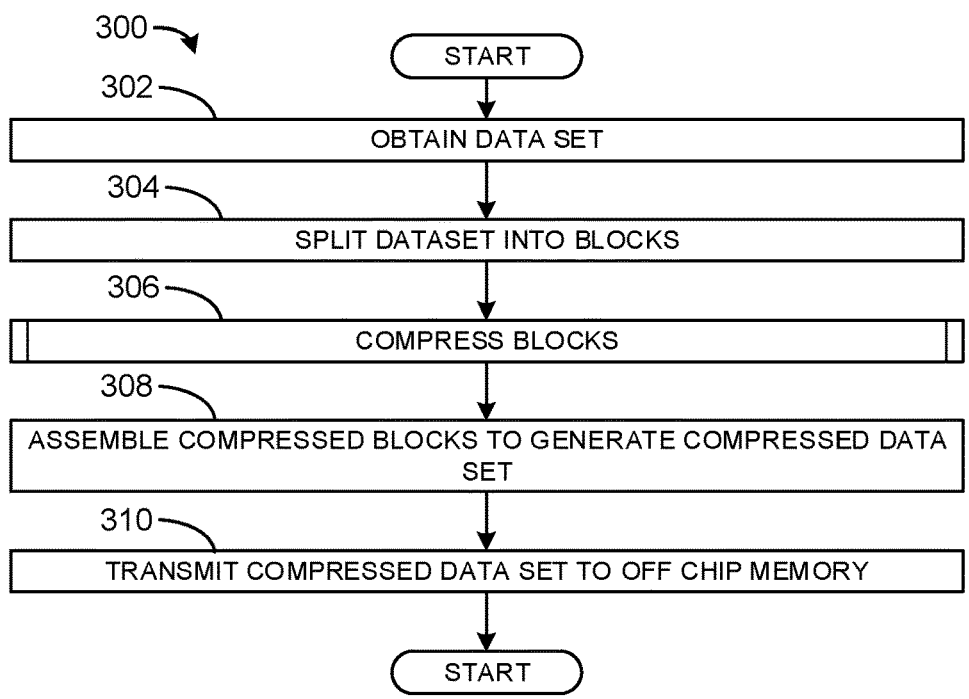
FIGS. 3-4 are flowcharts representative of example machine readable instructions which may be executed to implement the example data compressor of FIGS. 1 and/or 2 to compress a data set.
Figure 4:
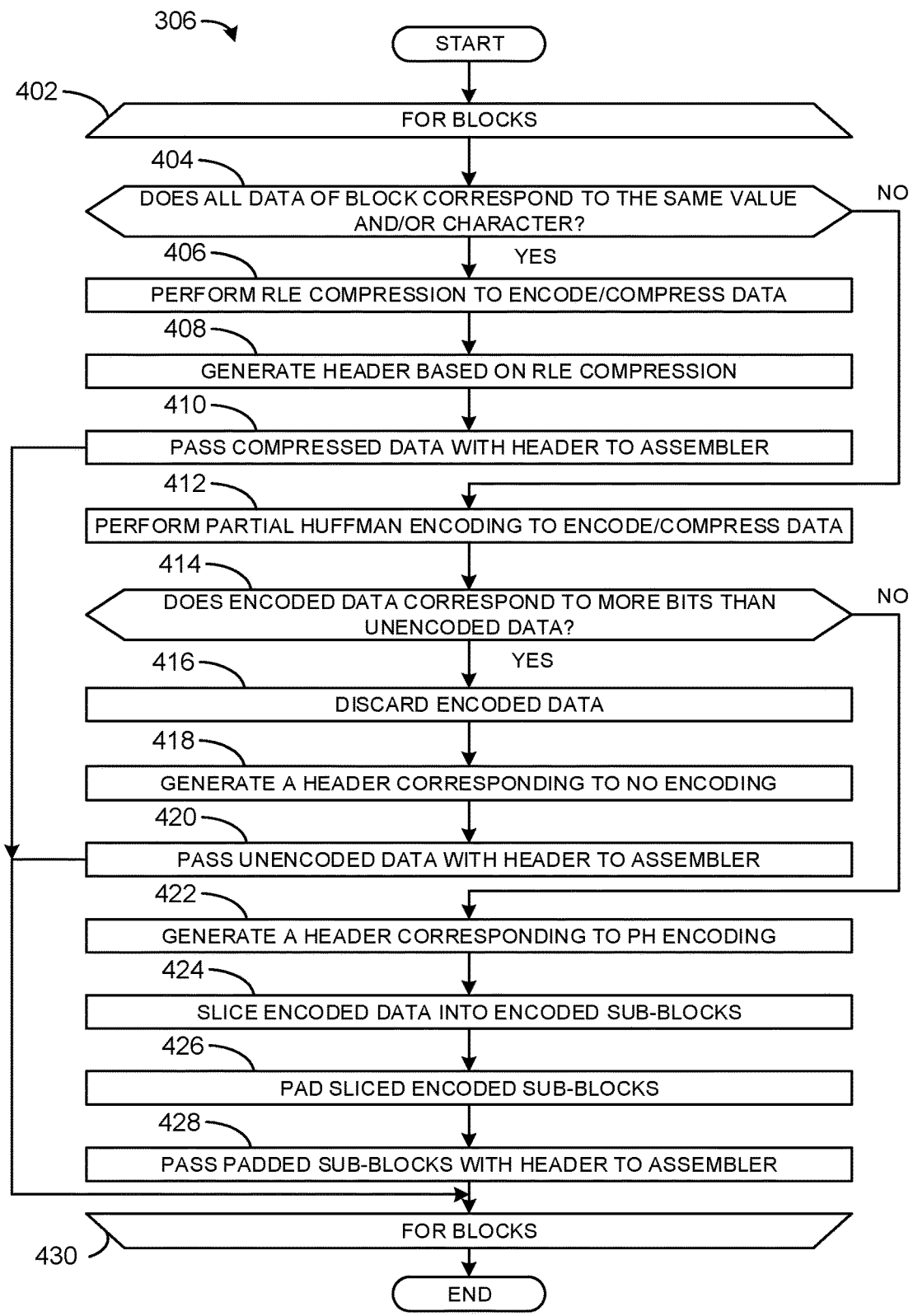
Figure 5:
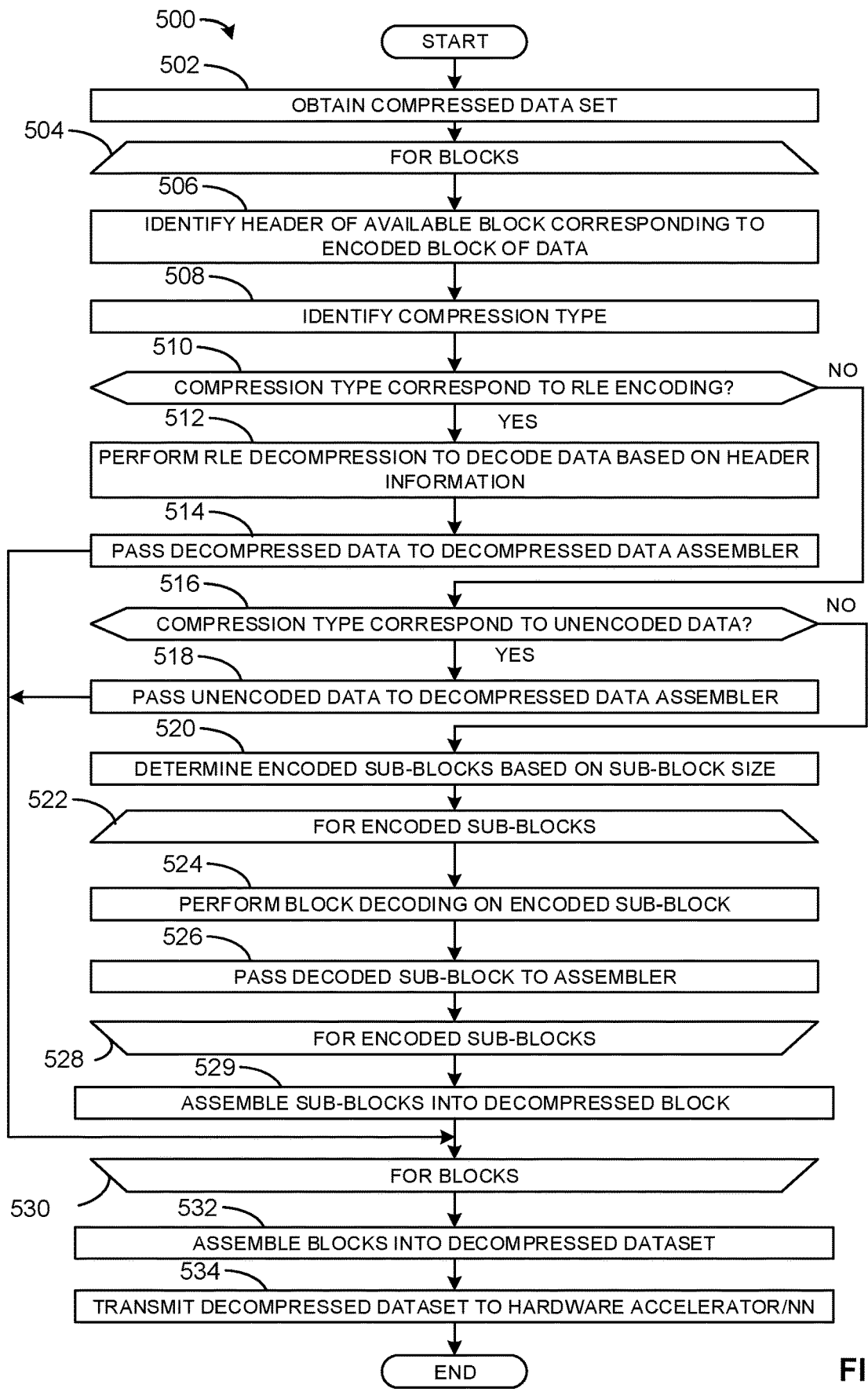
FIG. 5 is a flowchart representative of example machine readable instructions which may be executed to implement the example data decompressor of FIGS. 1 and/or 2 to decompress a compressed data set.

Flowcharts representative of example hardware logic, machine readable instructions, hardware implemented state machines, and/or any combination thereof for implementing the example data compressor 106 of FIG. 1 and/or FIG. 2 are shown in FIGS. 3-4. A flowchart representative of example hardware logic, machine readable instructions, hardware implemented state machines, and/or any combination thereof for implementing the example data decompressor 108 of FIG. 1 and/or FIG. 2 is shown in FIG. 5. The machine readable instructions may be an executable program or portion of an executable program for execution by a computer processor such as the processor 712, 812 shown in the example processor platform 700, 800 discussed below in connection with FIGS. 7 and/or 8. The program may be embodied in software stored on a non-transitory computer readable storage medium such as a CD-ROM, a floppy disk, a hard drive, a DVD, a Blu-ray disk, or a memory associated with the processor 712, 812 but the entire program and/or parts thereof could alternatively be executed by a device other than the processor 712, 812 and/or embodied in firmware or dedicated hardware. Further, although the example program is described with reference to the flowcharts illustrated in FIGS. 3-5, many other methods of implementing the example data compressor 106 and/or the data decompressor 108 of FIG. 2 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 3-5 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

FIG. 3 is an example flowchart 300 representative of example machine readable instructions that may be executed by the example implementation of the data compressor 106 of FIG. 1 and/or 2 to compress data stored off-chip prior to being transmitted to the on-chip components 102 of FIG. 1. Although the flowchart 300 of FIG. 3 is described in conjunction with the example data compressor 106 of FIG. 1 and/or 2, other type(s) of data compressor(s) and/or other type(s) of processor(s) may be utilized instead. Although the example flowchart 300 of FIG. 3 is described in conjunction with an RLE compression, Huffman compression, and/or no compression, other compression techniques may additionally or alternatively be used.

At block 302, the example data slicer(s) 202 obtains a data set from the example off-chip memory 104 via the example memory interface 200. The data set is a set of data stored in the example off-chip memory 104 that is to be used by the example on-chip hardware accelerator/neural network 110 of FIG. 1 to perform hardware based processing of the data set. At block 304, the data slicer(s) 202 splits the data set into N blocks of data. The size and/or number of blocks may be based on user and/or manufacturer preferences. The N blocks of data may or may not be uniformly sized. At block 306, the example data compressor 106 compresses the blocks of data, as further described below in conjunction with FIG. 4.

At block 308, the example compressed data assembler 212 assembles the compressed blocks to generate a compressed data set. For example, if the data compressor 106 compresses the blocks in order, the data assembler 212 attaches the compressed blocks in the same order as the blocks were compressed. If the data compressor 106 compresses the block out of order or in parallel, the data assembler 212 monitors the compression to be able to reassemble the compressed blocks of data in the same order as the data from the dataset. At block 310 the example interface 202 transmits the compressed data set to the off-chip memory 104 of FIG. to be stored as compressed data.

FIG. 4 is an example flowchart 306 representative of example machine readable instructions that may be executed by the example implementation of the data compressor 106 of FIG. 1 and/or 2 to compress blocks of data, as described above in conjunction with FIG. 3. Although the flowchart 306 of FIG. 4 is described in conjunction with the example data compressor 106 of FIG. 1 and/or 2, other type(s) of data compressor(s) and/or other type(s) of processor(s) may be utilized instead. The example flowchart 306 of FIG. 4 may be performed on a plurality of blocks of data linearly and/or in parallel (e.g., by parallel data slicers 202, data processors 204, compressors 206, header generators 208, and/or padders 210). Although the example flowchart 306 of FIG. 4 is described in conjunction with an RLE compression, Huffman compression, and/or no compression, other compression techniques may additionally or alternatively be used.

For each of the N blocks of data (blocks 402-430), the example data processor(s) 204 determines if all the data of the block of data corresponds to a same value and/or character (block 404). For example, if a block of data includes all 'a's, the example data processor(s) 204 determines that all the data of the block of data corresponds to a same character.

If the example data processor(s) 204 determines that all of the data of the block corresponds to the same value and/or character (block 404: YES), the example compressor(s) 206 performs a RLE compression technique to encode/compress the data of the block (block 406). For example, the compressor(s) 206 may instruct the header generator(s) 208 to generate a data packet identifying the repeated character and/or a number of times that the character is repeated in the block of data. At block 408, the example header generator(s) 208 generates a data packet and/or header to include with the compressed data that identifies that the block of data was compressed using an RLE compression technique. In this manner, the example data decompressor 108 can identify the block as corresponding to an RLE compression and decompress the block based on RLE decompression techniques.

If the example data processor(s) 204 determines that not all of the data of the block corresponds to the same value and/or character (block 404: NO), the example compressor(s) 206 performs a partial Huffman encoding technique to encode/compress the block of data (block 412). In some examples, the compressor(s) 206 may perform a full Huffman encoding technique. As described above, to apply Huffman encoding, the example compressor(s) 206 generates a Huffman tree based on the frequency of appearance of each character in a set of data. The compressor(s) 206 assigns a code for each character of data of the block based on the Huffman tree. In most cases, encoding data using a Huffman encoding technique results in a lossless data compression that is smaller in size than no encoding. To apply a partial Huffman encoding technique, the example compressor(s) 206 only applies the Huffman encoding techniques to a preset number of characters and leaving the rest of the characters unencoded, thereby increasing the encoding and/or decoding time and decreasing the size of the Huffman table needed to decode the Huffman encoded data. Additionally, the example compressor(s) 206 marks each character as encoded or unencoded.

At block 414, the example data processor(s) 204 determines if the encoded data and the header correspond to more bits than the unencoded data. As described above, a Huffman or partial Huffman compression technique may correspond to more data for blocks of data with little or no repetition of characters within the block. In some examples, the data processor(s) 204 may determine, based on the repetition of data within the block, whether a Huffman or partial Huffman compression will result in more bits prior to performing the compression (e.g., prior to block 412).

If the example data processor(s) 204 determines that the encoded data and the header correspond to more bits than the unencoded data (block 414: YES), the example data processor(s) 204 discard the encoded data (block 416). At block 418, the example header generator(s) 208 generates a header corresponding to the no encoding. In this manner, the example data decompressor 108 can determine that the data of the block is unencoded and/or uncompressed. At block 420, the example header generator 208 passes the unencoded data of the block with the generated header to the example compressed data assembler 212.

If the example data processor(s) 204 determines that the encoded data does not correspond to more bits than the unencoded data (block 414: NO), the example header generator(s) 208 generates a header corresponding to Huffman and/or partial Huffman (PF) encoding (block 422). In this manner, the example data decompressor 108 can identify the block as corresponding to an Huffman and/or PH compression and decompress the block based on Huffman and/or PH decompression techniques. At block 424, the example data slicer(s) 202 slices, splits, and/or groups the encoded data into encoded sub-blocks. The sub-blocks may include one or more Huffman codes. The number of Huffman codes per sub-block may be preset, customizable, and/or based on user and/or manufacturer preferences. For example, the number of Huffman codes per sub-block may correspond to the number of parallel processors in the example data decompressor 108, thereby optimizing the processing capacities of the data decompressor 108.

At block 424, the example padder(s) 210 pads the encoded sub-blocks using a predefined pattern. As described above, different Huffman codes may correspond to non-uniform (e.g., different) lengths as a result of the encoding process. For example, a first Huffman code may be 2 bits of data and a second Huffman code may be 4 bits of data. Accordingly, the size of the sliced sub-blocks may correspond to non-uniform (e.g., different) lengths. Thus, the example padder(s) 210 pads each of the encoded sub-blocks with a predefined pattern corresponding to an end of a sub-block. In some examples, the padding ensures that each variable sized sub-block is the same length (e.g., a selected length). In this manner, the example data decompressor 108 can separate the compressed sub-blocks for parallel decompression by separating the sub-blocks based on the selected sub-block length. Some examples, the padded sub-blocks are different length. In such examples, the data decompressor 108 breaks the encoded block into the sub-blocks based on the specified padding in the header. At block 428, the example padder(s) 210 passes the padded sub-blocks with the header to the example compressed data assembler 212 to be assembled in order prior to transmitting the example on-chip components 102 of FIG. 2.

FIG. 5 is an example flowchart 500 representative of example machine readable instructions that may be executed by the example implementation of the data decompressor 108 of FIG. 1 and/or 2 to decompress compressed data from the example off-chip components 100 of FIG. 1. Although the flowchart 500 of FIG. 5 is described in conjunction with the example data decompressor 108 of FIG. 1 and/or 2, other type(s) of data decompressor(s) and/or other type(s) of processor(s) may be utilized instead. Although the flowchart 500 is described in conjunction of a serial decompression of compressed blocks, the flowchart may be used in conjunction with a parallel decompression process where each block is processed in parallel.

At block 502, the example header processor 220 obtains a compressed data set from the example off-chip interface 218. The compressed data set corresponds to data stored in the example off-chip memory 104 that has been compressed by the example data compressor 106 using techniques disclosed herein. For each of the compressed blocks of data (blocks 504-530) (e.g., processed sequentially with a single decompressor 222), the example header processor 220 identifies the header of the available compressed block corresponding to encoded block of data (block 506). As described above, during compression of the data, each compressed block of data includes a header identifying the type of compression used to compress the block of data. Accordingly, at block 508, the example header processor 220 determines the compression and/or encoding type based on the header of the encoded block. Although the example flowchart 500 of FIG. 5 is described in conjunction with data that has been compressed using RLE compression, Huffman compression, and/or no compression, the header may correspond to additional and/or alternative compression techniques. In such examples, the data decompressor 108 decompresses the data based on such additional and/or alternative compression techniques.

For each of the compressed blocks of data (blocks 508-530) (e.g., split by the example data splitter 221 and processed sequentially with a single decompressor 222), the example decompressor(s) 222 determines if the compression type corresponds to RLE encoding and/or compression (block 510). If the example decompressor(s) 222 determines that the compression type corresponds to RLE encoding (block 510: YES), the example decompressor(s) 222 performs RLE decompression to decode data based on the header information (block 512). For example, if the header information identifies that the block of data corresponds to 16 repeated 'a's, the decompressor(s) 222 decompresses the data to generate 16 repeated 'a's. At block 514, the example decompressor(s) 222 passes the decompressed data (e.g., the 16 repeated 'a's in the above example) to the example decompression data assembler 224.

If the example decompressor(s) 222 determines that the compression type does not correspond to RLE encoding (block 510: NO), the example decompressor(s) 222 determines if the compression type corresponds to unencoded data (block 516). If the example decompressor(s) 222 determines that the compression type corresponds to unencoded data (block 516: YES), the example decompressor(s) 222 passes the unencoded data to the decompressed data assembler 224. If the example decompressor(s) 222 determines that the compression type does not correspond to unencoded data (block 516: NO), the example decompressor(s) 222 determines the encoded sub-blocks of the Huffman or partial Huffman encoded block of data based on the sub-blocks sized identified in the header (block 520). As described above, the example data compressor 106 pads the ends of the sub-block of a block of data with a predefined end pattern. In this manner, the example decompressor(s) 222 can break the block into the sub-blocks based on the sub-block size identified in the header.

For each encoded sub-block (blocks 520-528) (e.g., split into the sub-blocks by the example data splitter 221 and processed linearly using a single decompressor 222 or in parallel using multiple decompressors 222), the example decompressor(s) 222 perform block (e.g., a partial or full Huffman) decoding on the encoded sub-block (block 524). For example, the decompressor(s) 222 may utilize a Huffman table that corresponds Huffman codes to character representative of the decompressed data to decompress and/or decode the characters marked as encoded and keep unchanged the characters marked as unencoded. At block 526, the example decompressor(s) 222 passes the decoded sub-block to the decompressed data assembler 224. At block 529, the example decompressed data assembler 224 assembles the sub-blocks into a decompressed block.

At block 532, the example decompressed data assembler 224 assembles the decoded blocks into a decompressed dataset in order corresponding to the dataset stored in the example off-chip memory 104. At block 534, the example hardware accelerator/neural network interface 226 transmits the decompressed dataset to the hardware accelerator/neural network 110 of FIG. 1.

Figure 6:
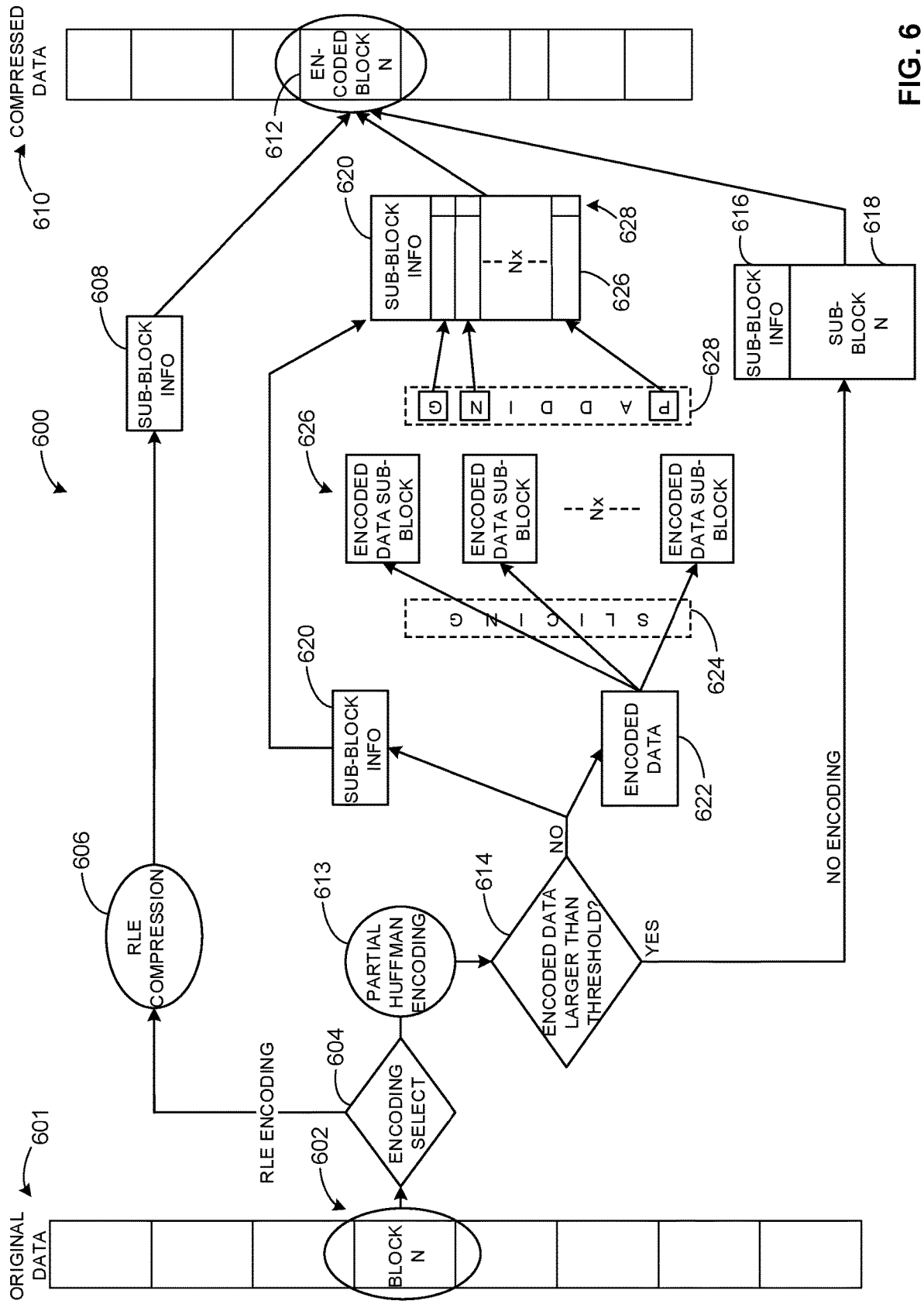
FIG. 6 illustrates an example data decompression process that may be performed by the data decompressor of FIGS. 1 and/or 2.

FIG. 6 illustrates an example data decompression process 600 of data from the example off-chip components 100 of FIG. 1 using the example data compressor 106 of FIG. 1 and/or 2. The example decompression process 600 includes an example dataset 601, an example block of data 602, example decision blocks 604, 614, an example RLE compression 606, example headers 608, 616, 620, an example compressed dataset 610, an example encoded block 612, an example Huffman compression 613, example encoded data blocks 616, an example unencoded data block 618, an example encoded block 622, example slicing 624, example encoded sub-blocks 626, and example padding 628.

The example dataset 601 of FIG. 6 corresponds to data that is stored in the example off-chip memory 100. The example data slicer(s) 202 slices the dataset 601 into blocks of data, including the example block of data 602. Once sliced, the example data processor(s) 204 selects an encoding technique based on the characteristics of the data of the block of data 602 at decision block 604. If the data processor(s) 204 determines that all the data of the block is the same, the data processor(s) 204 selects RLE compression 606 to compress the block of data 602. If the data processor(s) 204 determines that not all of the data of the block is the same, the data processor(s) 204 select partial Huffman compression (or full Huffman compression) 613.

If RLE compression 606 is selected, the example header generator(s) 208 generates the example header 608 corresponding to the RLE compression technique, identifying a value representative of all the data in the data block and the number of repetition identified in the header. Accordingly, the example header 608 is included as the encoded block of data 612 in the compressed dataset 610. If partial Huffman compression 613 is selected, once the compressor(s) 206 performs the partial Huffman compression 613, the data processor(s) 204 determine if the encoded data and the header are larger than a threshold (e.g., the threshold corresponding to the amount of data corresponding to the unencoded data block 602). If the data processor(s) 204 determines that the encoded data and corresponding header is larger than the threshold, the compressor(s) 206 discards the encoded data block and the example header generator(s) 208 generates the example header 616 corresponding to no encoding and includes the header 616 with the unencoded data block 602 as the encoded block 612 of the compressed dataset 610.

If the data processor(s) 204 determines that the encoded data and corresponding header is smaller than the threshold, the example header generator(s) 208 generates the example header 620 identifying the partial Huffman compression 613. Additionally, the example data slicer(s) 202 slices the Huffman encoded data 622 at the example slicing block 624 to generate the encoded sub-blocks 626. Because the encoded data sub-blocks 626 may be non-uniformly sized (e.g., each data sub-block 626 may correspond to a different size), the example padder(s) 210 pad the encoded data sub-blocks 626 with a selected pattern at the example padding block 628. Additionally, the header generator 208 adds the size of each sub-block to the header. In this manner, the example data decompressor 108 can break the encoded block 612 into the example encoded data sub-block 626 by based on the identified size. Once padded, the header 620 and the padded sub-blocks and corresponding headers are included in the example compressed dataset 610 as the encoded block 612.

Figure 7:
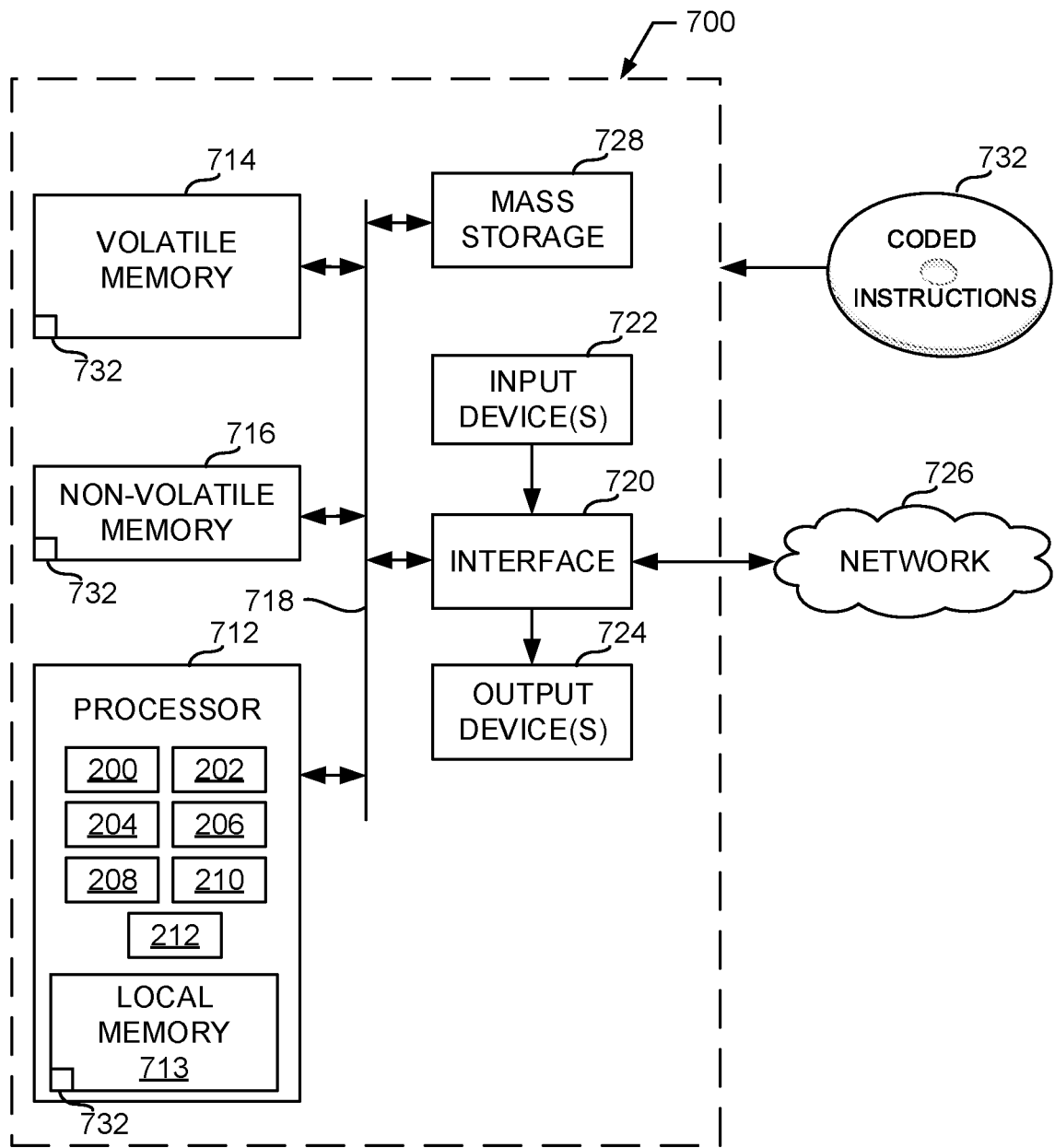
FIG. 7 is a block diagram of an example processing platform structured to execute the instructions of FIGS. 3-4 to implement the example data compressor of FIGS. 1 and/or 2.

FIG. 7 is a block diagram of an example processor platform 700 structured to execute the instructions of FIGS. 3-4 to implement the example data compressor 106 of FIG. 2. The processor platform 700 can be, for example, a server, a personal computer, a workstation, a self-learning machine (e.g., a neural network), a mobile device (e.g., a cell phone, a smart phone, a tablet such as an iPad™), or any other type of computing device.

The processor platform 700 of the illustrated example includes a processor 712. The processor 712 of the illustrated example is hardware. For example, the processor 712 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example memory interface 200, the example data slicer(s) 202, the example data processor(s) 204, the example compressor(s) 206, the example header generator(s) 208, the example padder(s) 210, and/or the example compressed data assembler 212 of FIG. 2.

The processor 712 of the illustrated example includes a local memory 713 (e.g., a cache). In some examples, the local memory 713 implements the example result storage 218. The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 716 may be implemented by flash memory and/or any other desired type of memory device. Access to the main memory 714, 716 is controlled by a memory controller.

The processor platform 700 of the illustrated example also includes an interface circuit 720. The interface circuit 720 may be implemented by any type of interface standard, such as an Ethernet interface, a universal serial bus (USB), a Bluetooth® interface, a near field communication (NFC) interface, and/or a PCI express interface.

In the illustrated example, one or more input devices 722 are connected to the interface circuit 720. The input device(s) 722 permit(s) a user to enter data and/or commands into the processor 712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 720 of the illustrated example, thus, typically includes a graphics driver card, a graphics driver chip and/or a graphics driver processor.

The interface circuit 720 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 726. The communication can be via, for example, an Ethernet connection, a digital subscriber line (DSL) connection, a telephone line connection, a coaxial cable system, a satellite system, a line-of-site wireless system, a cellular telephone system, etc.

The processor platform 700 of the illustrated example also includes one or more mass storage devices 728 for storing software and/or data. Examples of such mass storage devices 728 include floppy disk drives, hard drive disks, compact disk drives, Blu-ray disk drives, redundant array of independent disks (RAID) systems, and digital versatile disk (DVD) drives.

The machine executable instructions 732 of FIGS. 3-4 may be stored in the mass storage device 728, in the volatile memory 714, in the non-volatile memory 716, and/or on a removable non-transitory computer readable storage medium such as a CD or DVD.

Figure 8:
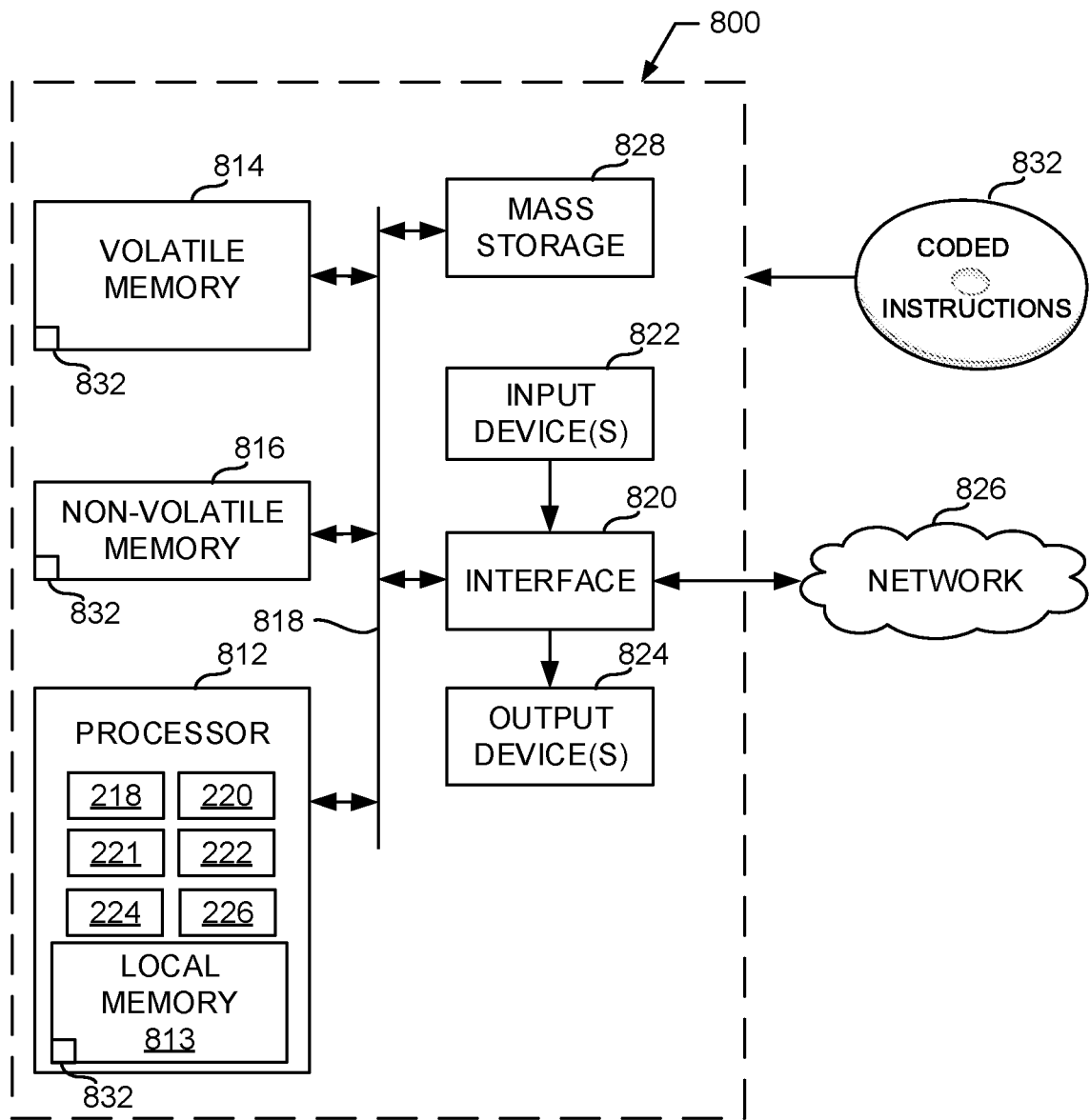
FIG. 8 is a block diagram of an example processing platform structured to execute the instructions of FIG. 5 to implement the example data decompressor of FIGS. 1 and/or 2.

FIG. 8 is a block diagram of an example processor platform 800 structured to execute the instructions of FIG. 5 to implement the example data compressor 106 of FIG. 2. The processor platform 800 can be, for example, a server, a personal computer, a workstation, a self-learning machine (e.g., a neural network), a mobile device (e.g., a cell phone, a smart phone, a tablet such as an iPad™), or any other type of computing device.

The processor platform 800 of the illustrated example includes a processor 812. The processor 812 of the illustrated example is hardware. For example, the processor 812 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example off-chip interface 218, the example header processor 220, the example data splitter 221, the example decompressor(s) 222, the example decompressed data assembler 224, and/or the example hardware accelerator/neural network interface 226 of FIG. 2.

The processor 812 of the illustrated example includes a local memory 813 (e.g., a cache). In some examples, the local memory 813 implements the example result storage 218. The processor 812 of the illustrated example is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), a Bluetooth® interface, a near field communication (NFC) interface, and/or a PCI express interface.

In the illustrated example, one or more input devices 822 are connected to the interface circuit 820. The input device(s) 822 permit(s) a user to enter data and/or commands into the processor 812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 820 of the illustrated example, thus, typically includes a graphics driver card, a graphics driver chip and/or a graphics driver processor.

The interface circuit 820 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 826. The communication can be via, for example, an Ethernet connection, a digital subscriber line (DSL) connection, a telephone line connection, a coaxial cable system, a satellite system, a line-of-site wireless system, a cellular telephone system, etc.

The processor platform 800 of the illustrated example also includes one or more mass storage devices 828 for storing software and/or data. Examples of such mass storage devices 828 include floppy disk drives, hard drive disks, compact disk drives, Blu-ray disk drives, redundant array of independent disks (RAID) systems, and digital versatile disk (DVD) drives.

The machine executable instructions 832 of FIG. 5 may be stored in the mass storage device 828, in the volatile memory 814, in the non-volatile memory 816, and/or on a removable non-transitory computer readable storage medium such as a CD or DVD.

Example methods, apparatus, systems, and articles of manufacture to compress data are disclosed herein. Further examples and combinations thereof include the following:

Example 1 includes an apparatus comprising an off-chip memory to store data, a data slicer to split a dataset into a plurality of blocks of data, a data processor to select a first compression technique for a first block of the plurality of blocks of data based on first characteristics of the first block, and select a second compression technique for a second block of the plurality of blocks of data based on second characteristics of the second block, a first compressor to compress the first block using the first compression technique to generate a first compressed block of data, a second compressor to compress the second block using the second compression technique to generate a second compressed block of data, a header generator to generate a first header identifying the first compression technique and a second header identifying the second compression technique, and an interface to transmit the first compressed block of data with the first header and the second compressed block of data with the second header to be stored in the off chip memory.

Example 2 includes the apparatus of example 1, wherein the data processor is to select the first compression technique when the data of the block corresponds to a same value and select the second compression technique when the data of the block include at least one different value.

Example 3 includes the apparatus of example 1, wherein the first compression technique is at least one of a Huffman compression technique, an RLE compression technique, or a no compression technique.

Example 4 includes the apparatus of example 3, wherein data processor is to select the first compression technique to be the no compression technique when a Huffman compression technique results in more data than the no compression technique.

Example 5 includes the apparatus of example 1, wherein the compressor is to split the first compressed block of data into sub-blocks of first compressed data.

Example 6 includes the apparatus of example 5, wherein the sub-blocks of first compressed data are non-uniform in size.

Example 7 includes the apparatus of example 5, further including one or more padders to pad the sub-blocks with a pattern by adding the pattern to the sub-blocks.

Example 8 includes the apparatus of example 1, wherein the blocks of data are uniformly sized.

Example 9 includes the apparatus of example 1, wherein the first compressor and the second compressor are to perform the first and second compression techniques on the respective blocks in parallel.

Example 10 includes the apparatus of example 1, wherein the compressor is to, when the first selected compression technique results in more data than a no compression technique, discard the first compressed block of data and retain the uncompressed block of data.

Example 11 includes the apparatus of example 10, wherein first header identifies the no compression technique.

Example 12 includes a non-transitory computer readable storage medium comprising instructions which, when executed, cause a machine to at least split a dataset into a plurality of blocks of data, select a first compression technique for a first block of the plurality of blocks of data based on first characteristics of the first block, and select a second compression technique for a second block of the plurality of blocks of data based on second characteristics of the second block, compress the first block using the first compression technique to generate a first compressed block of data, compress the second block using the second compression technique to generate a second compressed block of data, generate a first header identifying the first compression technique and a second header identifying the second compression technique, and store the first compressed block of data with the first header and the second compressed block of data with the second header in the chip memory.

Example 13 includes the computer readable storage medium of example 12, wherein the instructions cause the machine to select the first compression technique when the data of the block corresponds to a same value and select the second compression technique when the data of the block include at least one different value.

Example 14 includes the computer readable storage medium of example 12, wherein the first compression technique is at least one of a Huffman compression technique, an RLE compression technique, or a no compression technique.

Example 15 includes the computer readable storage medium of example 14, wherein the instructions cause the machine to select the first compression technique to be the no compression technique when a Huffman compression technique results in more data than the no compression technique.

Example 16 includes the computer readable storage medium of example 12, wherein the instructions cause the machine to split the first compressed block of data into sub-blocks of first compressed data.

Example 17 includes the computer readable storage medium of example 16, wherein the sub-blocks of first compressed data are non-uniform in size.

Example 18 includes the computer readable storage medium of example 16, wherein the instructions cause the machine to pad the sub-blocks with a pattern by adding the pattern to the sub-blocks.

Example 19 includes the computer readable storage medium of example 12, wherein the blocks of data are uniformly sized.

Example 20 includes the computer readable storage medium of example 12, wherein the instructions cause the machine to perform the first and second compression techniques on the respective blocks in parallel.

Example 21 includes the computer readable storage medium of example 12, wherein the instructions cause the machine to, when the first selected compression technique results in more data than a no compression technique, discard the first compressed block of data and retain the uncompressed block of data.

Example 22 includes the computer readable storage medium of example 20, wherein first header identifies the no compression technique.

Example 23 includes a method comprising splitting a dataset into a plurality of blocks of data, selecting a first compression technique for a first block of the plurality of blocks of data based on first characteristics of the first block, and selecting a second compression technique for a second block of the plurality of blocks of data based on second characteristics of the second block, compressing the first block using the first compression technique to generate a first compressed block of data, compressing the second block using the second compression technique to generate a second compressed block of data, generating a first header identifying the first compression technique and a second header identifying the second compression technique, and storing the first compressed block of data with the first header and the second compressed block of data with the second header in the off chip memory.

Example 24 includes the method of example 23, wherein the first compression technique is selected when the data of the block corresponds to a same value and the second compression technique is selected when the data of the block include at least one different value.

Example 25 includes the apparatus of example 23, wherein the first compression technique is at least one of a Huffman compression technique, an RLE compression technique, or a no compression technique.

Example 26 includes the apparatus of example 25, wherein the first compression technique is selected to be the no compression technique when a Huffman compression technique results in more data than the no compression technique.

Example 27 includes the apparatus of example 23, further including splitting the first compressed block of data into sub-blocks of first compressed data.

Example 28 includes the apparatus of example 27, wherein the sub-blocks of first compressed data are non-uniform in size.

Example 29 includes the apparatus of example 27, further including padding the sub-blocks with a pattern by adding the pattern to the sub-blocks.

Example 30 includes the apparatus of example 23, wherein the blocks of data are uniformly sized.

Example 31 includes the apparatus of example 23, wherein the first and second compression techniques are performed on the respective blocks in parallel.

Example 32 includes the apparatus of example 23, further including, when the first selected compression technique results in more data than a no compression technique, discard the first compressed block of data and retain the uncompressed block of data.

Example 33 includes the apparatus of example 32, wherein first header identifies the no compression technique.

Example 34 is an example computer readable medium comprises first instructions that when executed cause a machine to at least one of distribute, configure, assemble, install, instantiate, retrieve, decompress, and decrypt second instructions for execution, the second instructions to, when executed, cause a machine to at least at least split a dataset into a plurality of blocks of data, select a first compression technique for a first block of the plurality of blocks of data based on first characteristics of the first block, and select a second compression technique for a second block of the plurality of blocks of data based on second characteristics of the second block, compress the first block using the first compression technique to generate a first compressed block of data, compress the second block using the second compression technique to generate a second compressed block of data, generate a first header identifying the first compression technique and a second header identifying the second compression technique, and store the first compressed block of data with the first header and the second compressed block of data with the second header in the chip memory.

Example 35 includes the computer readable storage medium of example 34, wherein the instructions cause the machine to select the first compression technique when the data of the block corresponds to a same value and select the second compression technique when the data of the block include at least one different value.

Example 36 includes the computer readable storage medium of example 34, wherein the first compression technique is at least one of a Huffman compression technique, an RLE compression technique, or a no compression technique.

Example 37 includes the computer readable storage medium of example 36, wherein the instructions cause the machine to select the first compression technique to be the no compression technique when a Huffman compression technique results in more data than the no compression technique.

Example 38 includes the computer readable storage medium of example 34, wherein the instructions cause the machine to split the first compressed block of data into sub-blocks of first compressed data.

Example 39 includes the computer readable storage medium of example 38, wherein the sub-blocks of first compressed data are non-uniform in size.

Example 40 includes the computer readable storage medium of example 38, wherein the instructions cause the machine to pad the sub-blocks with a pattern by adding the pattern to the sub-blocks.

Example 41 includes the computer readable storage medium of example 34, wherein the blocks of data are uniformly sized.

Example 42 includes the computer readable storage medium of example 34, wherein the instructions cause the machine to perform the first and second compression techniques on the respective blocks in parallel.

Example 43 includes the computer readable storage medium of example 34, wherein the instructions cause the machine to, when the first selected compression technique results in more data than a no compression technique, discard the first compressed block of data and retain the uncompressed block of data.

Example 44 includes the computer readable storage medium of example 42, wherein first header identifies the no compression technique.

From the foregoing, it will be appreciated that example methods, apparatus and articles of manufacture have been disclosed that to compress data stored in off-chip memory prior to being transmitted to an on-chip neural network and/or hardware accelerator. The disclosed methods, apparatus and articles of manufacture improve the efficiency of a computing device by facilitating utilization of off-chip memory with on-chip neural network and/or hardware accelerators to increase memory capacity. Using examples disclosed herein, a user can tailor a compression scheme to a specific application data profile to achieve a higher compression ratio. By compressing the data prior to transferring the data from the off-chip components to the on-chip components, the example disclosed herein prevent, or otherwise reduce, the bottleneck effect of transmitting the data without compression. Additionally, by breaking the data into block and/or sub-blocks of data, examples disclosed herein facilitate parallel decoding of the data using the on-chip components, thereby increasing processing bandwidth for the on-chip components. Using a partial Huffman encoding scheme examples disclosed herein reduces a Huffman encoding lookup table requirements to be compatible with hardware memory limitation and speed requirement. Accordingly, disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
memory;
instructions in the apparatus;
processor circuitry to execute the instructions to:
select a first compression technique for a first block of a plurality of blocks of data based on first characteristics of the first block, the plurality of blocks of data corresponding to a dataset; and
select a second compression technique for a second block of the plurality of blocks of data based on second characteristics of the second block;
a first compressor to:
compress the first block using the first compression technique to generate a first compressed block of data; and
when the first selected compression technique results in more data than a no compression technique, discard the first compressed block of data and retain the first block of data;
a second compressor to compress the second block using the second compression technique to generate a second compressed block of data;
a header generator to generate a first header identifying the no compression technique and a second header identifying the second compression technique; and
an interface to transmit the first block of data with the first header and the second compressed block of data with the second header to be stored in the memory.

2. The apparatus of claim 1, wherein the processor is to select the first compression technique when the data of the block corresponds to a same value and select the second compression technique when the data of the block include at least one different value.

3. The apparatus of claim 1, wherein the second compression technique is at least one of a Huffman compression technique, an RLE compression technique, or the no compression technique.

4. The apparatus of claim 1, wherein the second compressor is to split the second compressed block of data into sub-blocks of compressed data.

5. The apparatus of claim 4, further including one or more padders to pad the sub-blocks with a pattern by adding the pattern to the sub-blocks.

6. The apparatus of claim 1, wherein the blocks of data are uniformly sized.

7. The apparatus of claim 1, wherein the first compressor and the second compressor are to perform the first and second compression techniques on the respective blocks in parallel.

8. An apparatus comprising:
memory;
instructions in the apparatus;
processor circuitry to execute the instructions to:
select a first compression technique for a first block of a plurality of blocks of data based on first characteristics of the first block, the plurality of blocks of data corresponding to a dataset, the first compression technique being at least one of a Huffman compression technique, an RLE compression technique, or a no compression technique, the first compression technique to be the no compression technique when the Huffman compression technique results in more data than the no compression technique; and
select a second compression technique for a second block of the plurality of blocks of data based on second characteristics of the second block;
a first compressor to compress the first block using the first compression technique to generate a first compressed block of data;
a second compressor to compress the second block using the second compression technique to generate a second compressed block of data;
a header generator to generate a first header identifying the first compression technique and a second header identifying the second compression technique; and an interface to transmit the first compressed block of data with the first header and the second compressed block of data with the second header to be stored in the memory.

9. An apparatus comprising:
memory;
instructions in the apparatus;
processor circuitry to execute the instructions to:
    select a first compression technique for a first block of a plurality of blocks of data based on first characteristics of the first block, the plurality of blocks of data corresponding to a dataset; and
    select a second compression technique for a second block of the plurality of blocks of data based on second characteristics of the second block;
a first compressor to:
    compress the first block using the first compression technique to generate a first compressed block of data; and
    split the first compressed block of data into sub-blocks of first compressed data, wherein the sub-blocks of first compressed data are non-uniform in size;
a second compressor to compress the second block using the second compression technique to generate a second compressed block of data;
a header generator to generate a first header identifying the first compression technique and a second header identifying the second compression technique; and
an interface to transmit the first compressed block of data with the first header and the second compressed block of data with the second header to be stored in the memory.

10. A non-transitory computer readable storage medium comprising instructions which, when executed, cause a machine to at least:
    split a dataset into a plurality of blocks of data;
    select a first compression technique for a first block of the plurality of blocks of data based on first characteristics of the first block; and
    select a second compression technique for a second block of the plurality of blocks of data based on second characteristics of the second block;
    compress the first block using the first compression technique to generate a first compressed block of data;
    when the first selected compression technique results in more data than a no compression technique, discard the compressed block of data and retain the first block of data;
    compress the second block using the second compression technique to generate a second compressed block of data;
    generate a first header identifying the no compression technique and a second header identifying the second compression technique; and
    cause storage of the first block of data with the first header and the second compressed block of data with the second header in memory.

11. The computer readable storage medium of claim 10, wherein the instructions cause the machine to select the first compression technique when the data of the block corresponds to a same value and select the second compression technique when the data of the block include at least one different value.

12. The computer readable storage medium of claim 10, wherein the second compression technique is at least one of a Huffman compression technique, an RLE compression technique, or the no compression technique.

13. The computer readable storage medium of claim 10, wherein the instructions cause the machine to split the second compressed block of data into sub-blocks of second compressed data.

14. The computer readable storage medium of claim 13, wherein the instructions cause the machine to pad the sub-blocks with a pattern by adding the pattern to the sub-blocks.

15. The computer readable storage medium of claim 10, wherein the blocks of data are uniformly sized.

16. The computer readable storage medium of claim 10, wherein the instructions cause the machine to perform the first and second compression techniques on the respective blocks in parallel.

17. A non-transitory computer readable storage medium comprising instruction which, when executed, cause a machine to at least:
    split a dataset into a plurality of blocks of data;
    select a first compression technique for a first block of the plurality of blocks of data based on first characteristics of the first block, the first compression technique to be a no compression technique when a Huffman compression technique results in more data than the no compression technique; and
    select a second compression technique for a second block of the plurality of blocks of data based on second characteristics of the second block;
    compress the first block using the first compression technique to generate a first compressed block of data;
    compress the second block using the second compression technique to generate a second compressed block of data;
    generate a first header identifying the first compression technique and a second header identifying the second compression technique; and
    cause storage of the first compressed first block of data with the first header and the second compressed block of data with the second header in memory.

18. A non-transitory computer readable storage medium comprising instruction which, when executed, cause a machine to at least:
    split a dataset into a plurality of blocks of data;
    select a first compression technique for a first block of the plurality of blocks of data based on first characteristics of the first block; and
    select a second compression technique for a second block of the plurality of blocks of data based on second characteristics of the second block;
    compress the first block using the first compression technique to generate a first compressed block of data;
    split the first compressed block of data into sub-blocks of first compressed data, wherein the sub-blocks of first compressed data are non-uniform in size;
    compress the second block using the second compression technique to generate a second compressed block of data;
    generate a first header identifying the first compression technique and a second header identifying the second compression technique; and
    cause storage of the first compressed first block of data with the first header and the second compressed block of data with the second header in memory.

19. A method comprising:
splitting a dataset into a plurality of blocks of data;
selecting, by executing an instruction with a processor, a first compression technique for a first block of the plurality of blocks of data based on first characteristics of the first block; and
selecting, by executing an instruction with the processor, a second compression technique for a second block of the plurality of blocks of data based on second characteristics of the second block;
compressing, by executing an instruction with the processor, the first block using the first compression technique to generate a first compressed block of data;
when the first selected compression technique results in more data than a no compression technique, discarding, by executing an instruction with the processor, the first compressed block of data and retain the first block of data;
compressing, by executing an instruction with the processor, the second block using the second compression technique to generate a second compressed block of data;
generating, by executing an instruction with the processor, a first header identifying the no compression technique and a second header identifying the second compression technique; and
storing the first block of data with the first header and the second compressed block of data with the second header in memory.

20. The method of claim 19, wherein the first compression technique is selected when the data of the block corresponds to a same value and the second compression technique is selected when the data of the block include at least one different value.

21. The method of claim 19, wherein the second compression technique is at least one of a Huffman compression technique, an RLE compression technique, or the no compression technique.

22. The method of claim 19, further including selecting the first compression technique when the data of the block corresponds to a same value and select the second compression technique when the data of the block include at least one different value.

23. The method of claim 19, wherein the second compression technique is at least one of a Huffman compression technique, an RLE compression technique, or the no compression technique.

24. A method comprising:
splitting a dataset into a plurality of blocks of data;
selecting, by executing an instruction with a processor, a first compression technique for a first block of the plurality of blocks of data based on first characteristics of the first block, the first compression technique to be a no compression technique when a Huffman compression technique results in more data than the no compression technique;
selecting, by executing an instruction with the processor, a second compression technique for a second block of the plurality of blocks of data based on second characteristics of the second block;
compressing, by executing an instruction with the processor, the first block using the first compression technique to generate a first compressed block of data;
compressing, by executing an instruction with the processor, the second block using the second compression technique to generate a second compressed block of data;
generating, by executing an instruction with the processor, a first header identifying the first compression technique and a second header identifying the second compression technique; and
storing the first compressed first block of data with the first header and the second compressed block of data with the second header in memory.

25. A method comprising:
splitting a dataset into a plurality of blocks of data;
selecting, by executing an instruction with a processor, a first compression technique for a first block of the plurality of blocks of data based on first characteristics of the first block;
selecting, by executing an instruction with the processor, a second compression technique for a second block of the plurality of blocks of data based on second characteristics of the second block;
compressing, by executing an instruction with the processor, the first block using the first compression technique to generate a first compressed block of data;
splitting, by executing an instruction with the processor, the first compressed block of data into sub-blocks of first compressed data, wherein the sub-blocks of first compressed data are non-uniform in size;
compressing, by executing an instruction with the processor, the second block using the second compression technique to generate a second compressed block of data;
generating, by executing an instruction with the processor, a first header identifying the first compression technique and a second header identifying the second compression technique; and
storing the first compressed first block of data with the first header and the second compressed block of data with the second header in memory.

\* \* \* \* \*